(12) United States Patent
Bianchi et al.

(10) Patent No.: US 12,342,641 B2
(45) Date of Patent: Jun. 24, 2025

(54) PIXEL WITH AN IMPROVED QUANTUM EFFICIENCY HAVING A MICRO-LENS AND A DIFFRACTIVE STRUCTURE

(71) Applicants: STMICROELECTRONICS (RESEARCH & DEVELOPMENT) LIMITED, Marlow (GB); STMicroelectronics (Crolles 2) SAS, Crolles (FR)

(72) Inventors: Raul Andres Bianchi, Myans (FR); Marios Barlas, Grenoble (FR); Alexandre Lopez, Edinburgh (GB); Bastien Mamdy, Le Versoud (FR); Bruce Rae, Edinburgh (GB); Isobel Nicholson, Edinburgh (GB)

(73) Assignees: STMICROELECTRONICS (RESEARCH & DEVELOPMENT) LIMITED, Marlow (GB); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 18/744,359

(22) Filed: Jun. 14, 2024

(65) Prior Publication Data
US 2024/0339464 A1    Oct. 10, 2024

Related U.S. Application Data

(63) Continuation of application No. 17/471,049, filed on Sep. 9, 2021, now Pat. No. 12,051,705.

(30) Foreign Application Priority Data

Sep. 11, 2020 (GR) .............................. 20200100550
Oct. 13, 2020 (FR) ...................................... 2010469

(51) Int. Cl.
| | | |
|---|---|---|
| H10F 39/00 | (2025.01) | |
| G02B 5/18 | (2006.01) | |
| H10F 39/12 | (2025.01) | |

(52) U.S. Cl.
CPC ....... *H10F 39/8023* (2025.01); *H10F 39/805* (2025.01); *G02B 5/18* (2013.01);
(Continued)

(58) Field of Classification Search
CPC .. H10F 39/8023; H10F 39/805; H10F 39/199; H10F 39/8027; H10F 39/8033;
(Continued)

(56) References Cited

U.S. PATENT DOCUMENTS

| | | |
|---|---|---|
| 9,231,014 B2 | 1/2016 | Frey et al. |
| 9,299,865 B2 | 3/2016 | Marty et al. |

(Continued)

FOREIGN PATENT DOCUMENTS

| | | |
|---|---|---|
| DE | 102018107914 A1 | 2/2019 |
| FR | 2964795 B1 | 9/2013 |

OTHER PUBLICATIONS

Frey et al., "Enhancing Near-Infrared Photodetection Efficiency in SPAD With Silicon Surface Nanostructuration," *Journal of the Electron Devices Society*, 6, Feb. 28, 2018, 392-395.

(Continued)

*Primary Examiner* — Marcos D. Pizarro
*Assistant Examiner* — Tiberiu Dan Onuta
(74) *Attorney, Agent, or Firm* — Seed IP Law Group LLP

(57) ABSTRACT

The present disclosure relates to a pixel comprising: a photodiode comprising a portion of a substrate of a semiconductor material, extending vertically from a first face of the substrate to a second face of the substrate configured to receive light; a layer of a first material covering each of the lateral surfaces of the portion; a layer of a second material (Continued)

covering the portion on the side of the first face, first and second material having refractive indexes lower than that of the semiconductor material; and a diffractive structure disposed on a face of the photodiode on the side of the second face.

20 Claims, 3 Drawing Sheets

(52) U.S. Cl.
 CPC .......... *G02B 5/1814* (2013.01); *G02B 5/1819* (2013.01); *G02B 5/1828* (2013.01); *G02B 5/1842* (2013.01); *H10F 39/199* (2025.01); *H10F 39/8027* (2025.01); *H10F 39/8033* (2025.01); *H10F 39/807* (2025.01)

(58) Field of Classification Search
 CPC ....... H10F 39/807; G02B 5/18; G02B 5/1814; G02B 5/1819; G02B 5/1828; G02B 5/1842; A23B 70/20; H10H 29/8506; H10D 89/921; H10D 64/64; A61K 40/4236; A61K 40/4225
 See application file for complete search history.

(56) References Cited

U.S. PATENT DOCUMENTS

| | | |
|---|---|---|
| 9,450,000 B2 | 9/2016 | Marty et al. |
| 9,640,704 B2 | 5/2017 | Frey et al. |
| 9,741,879 B2 | 8/2017 | Frey et al. |
| 9,985,072 B1 | 5/2018 | Wen et al. |
| 2019/0244992 A1 | 8/2019 | Yokogawa et al. |
| 2019/0257987 A1 | 8/2019 | Saari et al. |
| 2020/0027915 A1* | 1/2020 | Hsieh .................. H10F 39/8067 |
| 2020/0075656 A1* | 3/2020 | Lee ....................... H10F 10/163 |
| 2020/0135776 A1* | 4/2020 | Finkelstein ........... H10F 39/807 |
| 2020/0251510 A1 | 8/2020 | Ge |
| 2022/0057550 A1* | 2/2022 | Saari .................. H10F 39/8053 |

OTHER PUBLICATIONS

Oshiyama et al., "Near-infrared sensitivity enhancement of a back-illuminated complementary metal oxide semiconductor image sensor with a pyramid surface for diffraction structure," 2017 IEEE International Electron Devices Meeting (IEDM), Dec. 2-6, 2017, 16.4.1-16.4.4.

Zang, et al., "Silicon single-photon avalanche diodes with nano-structured light trapping," *Nature Communications*, 8(628):1-6, 2017.

* cited by examiner

PIXEL WITH AN IMPROVED QUANTUM EFFICIENCY HAVING A MICRO-LENS AND A DIFFRACTIVE STRUCTURE

BACKGROUND

Technical Field

The present disclosure relates generally to integrated electronic circuits, and more particularly to a pixel of an integrated image sensor.

Description of the Related Art

A pixel comprises a photosensitive area, or photoconversion area, configured to convert light in electrical charges. The photosensitive area of known pixels, typically a photodiode, is made of semiconductor material.

For a given semiconductor material, for example silicon, and given operating wavelengths, for example the wavelengths in the near infrared, the quantum efficiency of known pixels may be low, the quantum efficiency of a pixel being equal to the ratio of the number of electrical charges collected by the pixel with the number of incident photons of the pixel.

BRIEF SUMMARY

Improving the quantum efficiency of a pixel may be achieved with a pixel having a silicon photodiode being configured to operate with wavelengths in the near infrared.

For example, the quantum efficiency of a pixel having a silicon photodiode configured to operate as a single photon avalanche diode for wavelengths in the near infrared may be improved.

One embodiment provides a pixel, comprising:
a photodiode comprising a portion of a substrate made of a semiconductor material, extending vertically from a first face of the substrate to a second face of the substrate located opposite the first face and configured to receive light at an operating wavelength of the pixel;
a layer of a first material with a refractive index lower than a refractive index of the semiconductor material covering each of the lateral surfaces of said portion;
a layer of a second material with a refractive index lower than the refractive index of the semiconductor material covering said portion on the side of the first face; and
a diffractive structure disposed on a face of the photodiode on the side of the second face of the substrate.

According to an embodiment, each of the first and second materials is configured so that light at an operating wavelength of the pixel reaching an interface between the photodiode and said material with an angle of incidence greater than 30° is fully reflected.

According to an embodiment, the semiconductor material is silicon, the first material being silicon oxide and/or the second material being silicon oxide.

According to an embodiment:
the layer of the first material has a first surface in contact with said portion and a second surface located opposite the first surface covered with a metallic layer; and/or
the layer of the second material has a first surface in contact with said portion and a second surface located opposite the first surface covered with a metallic layer.

According to an embodiment, the diffractive structure is configured to diffract light at an operating wavelength of the pixel, which reaches the photodiode on the side of the second face of the substrate, mainly in two directions orthogonal to each other when projected onto a plane parallel to the second face.

According to an embodiment, the diffractive structure comprises trenches penetrating into said portion from the second face of the substrate, the trenches being filled with one or several third dielectric materials having a refractive index different from that of the semiconductor material.

According to an embodiment, the trenches of the diffractive structure, which are parallel to each other, are arranged at a pitch equal to twice an operating wavelength inside the pixel, at more or less 20%.

According to an embodiment, in a plane parallel to the second face, said photodiode has a square or rectangular shape.

According to an embodiment, in a plane parallel to the second face, the trenches comprise first trenches extending longitudinally in a first direction orthogonal to first and second opposite edges of the photodiode, and second trenches extending longitudinally in a second direction orthogonal to third and fourth opposite edges of the photodiode.

According to an embodiment, the first trenches do not contact the second trenches.

According to an embodiment, in a plane parallel to the second face:
a part of the first trenches forms a first diffraction grating extending from the first edge towards the center of the photodiode;
another part of the first trenches forms a second diffraction grating extending from the second edge of the photodiode towards the center of the photodiode;
a part of the second trenches forms a third diffraction grating extending from the third edge of the photodiode towards the center of the photodiode; and
another part of the second trenches forms a fourth diffraction grating extending from the fourth edge of the photodiode towards the center of the photodiode.

According to an embodiment, in a plane parallel to the second face:
a part of the second trenches forms a first diffraction grating extending from the first edge towards the center of the photodiode;
another part of the second trenches forms a second diffraction grating extending from the second edge of the photodiode towards the center of the photodiode;
a part of the first trenches forms a third diffraction grating extending from the third edge of the photodiode towards the center of the photodiode; and
another part of the first trenches forms a fourth diffraction grating extending from the fourth edge of the photodiode towards the center of the photodiode.

According to an embodiment, the first, second, third and fourth gratings do not intersect.

According to an embodiment, at least one of the first, second, third and fourth gratings comprises at least one periodicity defect among: an omitted trench, a modification of the width of a trench with respect to the other trenches of the network, a local modification of the pitch at which the trenches of the network are arranged.

According to an embodiment, the photodiode is configured to be used as a single photon avalanche photodiode, an operating wavelength of the pixel preferably belonging to a range from 700 nm to 2000 nm and being, for example, equal to 940 nm.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the implementation of the described pixel in an image sensor comprising a matrix of identical pixels has not been described, the implementation of such image sensor being in the abilities of those skilled in the art.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In the following disclosure, a pixel configured to operate with one or several wavelengths in the near infrared, that is to say in the range from 750 nm to 1400 nm, for example a pixel configured to operate with a wavelength equal to substantially 940 nm, is considered as an example. The photodiode of the pixel is further considered to be made of silicon, which has a poor light absorption for these wavelengths. It is further considered, as an example, that the pixel is configured so that its photodiode operates in a single photon avalanche mode, or, say in other words, that the pixel comprises a single photon avalanche diode or SPAD.

The inventors here propose to increase the quantum efficiency of a photodiode of a pixel by providing a structure for dispersing, out of the normal incident angle, the light which reaches the photodiode, and by providing, at the boundary of the volume of the photodiode, surfaces configured to reflect at least part of the dispersed light. As a result, the light pathlength in the photodiode is increased, which leads to an increase of the quantum efficiency.

Figure 1:
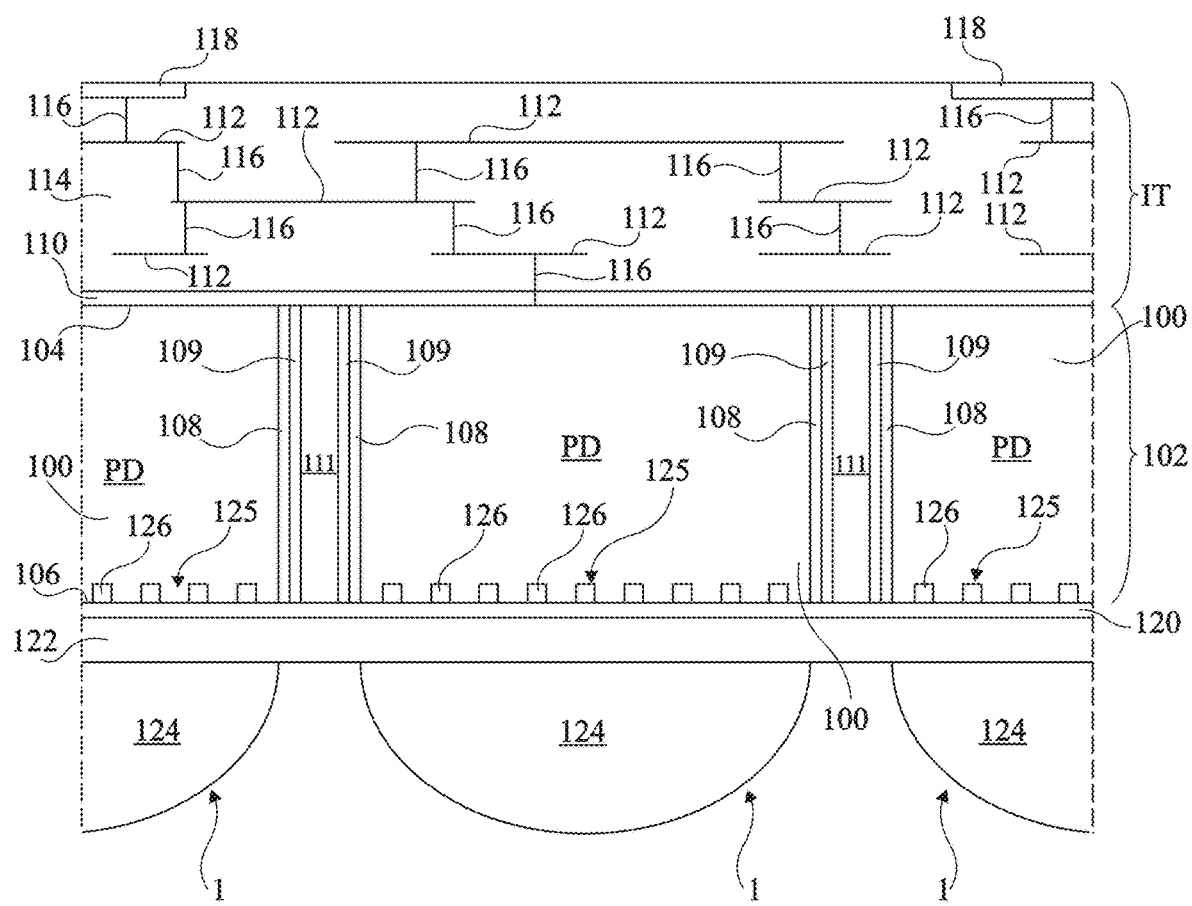
FIG. 1 is a schematic and cross-sectional view of an embodiment of a pixel.

FIG. 1 is a schematic and cross-sectional view of an embodiment of such a pixel 1. In the example of FIG. 1, the pixel 1 (in the middle of FIG. 1) is part of a matrix of pixels 1 of an image sensor, and two adjacent pixels 1 (in the left and in the right of FIG. 1) are also represented.

Each pixel 1 comprises a photodiode PD. The photodiode PD comprises a portion 100 of a substrate 102 made of a semiconductor material, for example silicon. Said in other words, the photodiode PD occupies a volume corresponding to that of the portion 100. The portion 100 extends vertically from a face 104 of the substrate 102 to a face 106 of the substrate 102, the face 106 being located opposite the face 104. The face 106 is configured for receiving light at an operating wavelength of the pixel 1. Said in other words, the pixel 1 is configured so that its photodiode PD receives light from the side of the face 106 of the substrate 102. Said in further other words, the pixel 1 is configured so that it receives light from the side of the face 106 of the substrate 102.

As an example, when the pixel 1 has one or several operating wavelengths in the near infrared, for example when the pixel 1 has an operating wavelength substantially equal to 940 nm, and when the substrate 102 is made of silicon, the height of the substrate 102, measured between faces 104 and 106, is in the range from 2 μm to 10 μm, typically substantially equal to 4.5 μm.

As an example, in a plane parallel to the face 106 of the substrate 102, the photodiode PD has a square or rectangular shape. As an example, when the pixel 1 has one or several operating wavelengths in the near infrared, for example when the pixel 1 has an operating wavelength substantially equal to 940 nm, and when the substrate 102 is made of silicon, in a plane parallel to the face 106 of substrate 102, the photodiode PD has the shape of a square having sides whose length is in the range from 2 μm to 20 μm, for example in the range from 5 μm to 10 μm (or in the range of 5 and 10 μm, inclusive of both).

In each pixel 1, a layer 108 of a material with a refractive index lower than that of the semiconductor material of the substrate 102 covers the lateral surfaces of the portion 100 of the substrate 102. More precisely, the layer 108 entirely covers the lateral surfaces of the portion 100 of the substrate 102. The lateral surfaces of the portion 100 are, for example, those which are transverse or substantially orthogonal to the faces 104 and 106 of substrate 102. Preferably, the material of the layer 108 is a dielectric material.

As the refractive index of the material of layer 108 is lower than that of the semiconductor material of the substrate 102, at least part of the light which propagates into the photodiode PD and reaches the interface between the portion 100 and the layer 108 is totally reflected. For example, when the substrate 102 is made of silicon and the layer 108 is made of silicon oxide, light having wavelengths in the near infrared, for example a wavelength substantially equal to 940 nm, is totally reflected when its incident angle on the interface is greater than 30°, the incident angle of the light being, for example, the angle between the normal to the interface and the direction of the incident light on the interface.

According to an embodiment, as illustrated in FIG. 1, a surface of layer 108 being located opposite a surface of layer 108 in contact with the portion 100 is covered, for example entirely covered, by a metal or metallic layer 109. As a result, all the light which propagates into the photodiode PD and reaches the interface between layers 108 and 109 is reflected by the metallic layer 109.

As an example, layer 108 and, possibly, layer 109 are formed by etching a vertical trench in the substrate 102, at the boundaries of the portion 100, by depositing layer 108 on the wall of the trench, and, possibly, by depositing layer 109 on the layer 108. As it can be seen in FIG. 1, a conductive material 111, for example doped silicon or polysilicon, can be then deposited to fill the trench. The use of a conductive material 111 insulated from the substrate 102 by the layer 108 allows to apply a bias voltage on the material 111, and thus to implement a capacitive deep trench insulation (CDTI).

In each pixel 1, a layer 110 of material with a refractive index lower than the refractive index of the semiconductor material of the substrate 102 covers the portion 100 on the side of the face 104 of the substrate 102. More precisely, the layer 110 entirely covers the portion 100 on the side of the face 104 of the substrate 102. For example, the layer 110 covers the entire face 104 of the substrate 102. Preferably, the material of the layer 110 is a dielectric material. Preferably, layer 108 and 110 are made of the same material.

Similarly to layer 108, layer 110 allows to reflect at least part of the light propagating into the photodiode PD when the light reaches the interface between the portion 100 and the layer 110.

According to an embodiment, not illustrated, a surface of the layer 110 being located opposite a surface of layer 110 in contact with the substrate 102 is covered with a metallic layer.

In the example of FIG. 1, an interconnection structure IT rests on the face 104 of the substrate 102, or, said in other words, rests on the substrate 102 on the side of the face 104. Layer 110 is, for example, a layer of this interconnection structure IT. The interconnection structure IT comprises portions of conductive, for example metal, conductive, or metallic, layers 112. The portions of layers 112 are electrically insulated from each other by insulating layers of the structure IT, represented here by a single layer 114 comprising the layer 110. Electrically conductive vias 116 of the structure IT are transverse to the metal layers 112, such as vertically passing through the insulating layer 114 to couple adjacent metal layers. The vias 116 electrically connect portions of layers 112 to each other and/or to integrated components made in and/or on the substrate 102 on the side of face 104 and/or to connection or contact pads 118 disposed on the side of a face of the interconnection structure which is located opposite face 104.

In each pixel 1, a layer 120 of material with a refractive index lower than the refractive index of the semiconductor material of the substrate 102 may cover the portion 100 on the side of the face 106 of the substrate 102. For example, the layer 120 entirely covers the portion 100 on the side of the face 106, and, for example, covers the entire face 106 of the substrate 102. Preferably, the material of the layer 120 is a dielectric material. Preferably, layers 108 and 120 are made of the same material.

Similarly to layer 108, layer 120 allows to reflect at least part of the light propagating into the photodiode PD when the light reaches the interface between the portion 100 and the layer 120.

In the example of FIG. 1, one or more layers 122 rest on the face 106 of the substrate 102, for example on a face of the layer 120 which is located opposite a face of layer 120 in contact with the substrate 102. The layers 122, for example, correspond to an anti-reflective structure and/or to filters for filtering certain wavelengths of the light reaching the pixel 1.

Preferably, as it is represented in FIG. 1, each pixel 1 comprises a micro-lens 124 configured to focalize the light received by the pixel 1 toward the photodiode PD of the pixel 1. The micro-lens 124 rests on the face 106 of the substrate 102, and is disposed in front of, or located opposite, the face of the portion 100 on the side of the face 106 of substrate 102. In the example of FIG. 1, the micro-lens 124 rests on and in contact with layer 122.

Layer 108, the possible layer 109, the possible layer 110, the possible metallic layer which covers layer 110, and the possible layer 120 allow to confine the light inside the photodiode PD of the pixel 1, or, said in other words, inside the portion 100 of the substrate 102.

Each pixel 1 further comprises a diffractive structure 125. The diffractive structure 125 is disposed on the face of the photodiode PD on the side of the face 106 of the substrate 102.

According to an embodiment, the diffractive structure 125 of a given pixel 1 is configured to diffract the incident light of the pixel 1, before or when the light reaches the photodiode PD of the pixel 1. Preferably, the diffractive structure 125 is configured to diffract the light mainly in two directions orthogonal to each other when these directions are projected onto a plane parallel to the face 106 of the substrate 102. Light is said to be diffracted mainly in two direction when, for example, at least 30% of the light reaching the diffractive structure 125 is diffracted in a first of these two directions and at least 30% of the light reaching the diffraction structure 125 is diffracted in a second of these two directions. Said in other words, at the output of the diffractive structure, all the diffraction orders superior to the zero order are suppressed in directions other than the two orthogonal directions in which the diffractive structure mainly diffracts the light.

According to an embodiment, the diffractive structure 125 comprises trenches 126, which penetrate into the portion 100 of the substrate 102 from the face 106 of the substrate 102. The trenches 126 are filled with one or several dielectric materials having a refractive index different from that of the semiconductor material of the substrate 102.

As an example, when the substrate 102 is made of silicon and the pixel 1 has operating wavelengths in the near infrared, for example an operative wavelength substantially equal to 940 nm, the trenches 126 penetrate the substrate 102 over a depth in the range from 100 to 500 nm, for example in the range from 200 to 400 nm. Further, when the substrate 102 is made of silicon and the pixel 1 has operating wavelengths in the near infrared, for example an operative wavelength substantially equal to 940 nm, the width of the trenches 126 is, for example, in the range from 100 to 300 nm.

As an example, when the substrate 102 is made of silicon and when the pixel 1 has operating wavelengths, for example, in the near infrared, the trenches 126 are filled with one or several dielectric materials among silicon nitride, aluminum oxide, tantalum oxide and lanthanum oxide.

According to an embodiment, the trenches 126, which are substantially parallel to one another, are arranged at a pitch equal to twice the operating wavelength inside the pixel 1, at more or less 20%. The wavelength inside the pixel is the effective wavelength inside the material of the photodiode PD and is equal to the operative wavelength of the pixel, taken in air or vacuum, divided by the refractive index n of the material of the photodiode PD. For example, when the operating wavelength (in air of vacuum) of the pixel 1 is in the near infrared, for example equal to 940 nm, and when the photodiode PD is in silicon having a refractive index n equal to 3.6, the pitch between parallel trenches 126 is in the range from 420 to 630 nm (in the range of 420 and 630 nm, inclusively).

More particularly, according to an embodiment, and as it will be described in more detail with FIGS. 2 to 6, the trenches 126 of the diffractive structure 125 of each pixel 1 comprises first trenches 1261 and second trenches 1262. The trenches 1261, 1262 are disposed so that, in a plane parallel to face 106 of substrate 102, the trenches 1261 extend longitudinally in a first direction, and the trenches 1262 extend longitudinally in a second direction orthogonal to the first direction. Preferably, the first direction is orthogonal to two opposite edges, or sides or lateral surfaces, of the photodiode PD, the second direction being orthogonal to two other opposite edges of the photodiode PD. According to this embodiment, the trenches 1261 allow to diffract the light mostly in the second direction, and the second trenches 1262 allow to diffract the light mostly in the first direction.

Preferably, the trenches 126 does not cross each other, or, said in other words, none of the trench 126 is in contact with another trench 126. In particular, the trenches 1261 preferably do not contact the trenches 1262, which simplifies the manufacturing of these trenches.

Preferably, the trenches 126 do not contact the layer 108.

The quantum efficiency of the pixel 1 is increased compared to a similar pixel which is devoid of the diffractive structure 125 and/or of the layers 108 and 110. For example, there is an improvement of the quantum efficiency by a factor greater than 2 between the pixel 1 and a similar pixel which is devoid of the diffractive structure.

A first pixel similar to pixel 1 but which is devoid of the structure 125 and of all the layers 108, 109, 110, 120 configured to confine light inside the photodiode PD, a second pixel similar to pixel 1 but which is devoid of the structure 125, and a third pixel similar to pixel 1 but which is devoid of all the layers 108, 109, 110, 120 configured to confine light inside the photodiode PD, are here considered. The quantum efficiency increase between pixel 1 and the first pixel is more than the sum of the quantum efficiency increase between the second and first pixels and of the quantum efficiency increase between the third and first pixels. Said in other words, the effect of the diffractive structure 125 and the effect of the layers 108 and 110 cooperate to improve the quantum efficiency of the pixel 1.

Example embodiments of the diffractive structure 125 of the pixel 1 of FIG. 1 will be now described in relation with the FIGS. 2 to 6. Each of the FIGS. 2 to 6 is a schematic view of the diffractive structure 125, taken in a plane parallel to the face 106 of substrate 102 (FIG. 1). More precisely, the diffractive structure 125 of each of the FIGS. 2 to 6 is represented as if the structure 125 is seen from the below in FIG. 1.

In these example embodiments, the photodiode PD of each pixel 1 has a square shape in a plane parallel to the face 106 of substrate 102. Further, the diffractive structure 125 of each pixel 1 is formed by the trenches 126 comprising first trenches 1261 and second trench 1262 as described above, in relation with FIG. 1. In each of the FIGS. 2 to 6, the layer 108, which in practice surrounds all the illuminated faces of the photodiode PD, or of the corresponding portion 100 of the substrate 102, is represented.

In the FIGS. 2 to 6, the trenches 1261, 1262 are disposed so that, in a plane parallel to face 106 of substrate 102, trenches 1261 extend longitudinally in a first direction (vertically in FIGS. 2 to 6) orthogonal or transverse to two opposite edges 200 and 202 of the photodiode PD, and trenches 1262 extend longitudinally in a second direction (horizontally in FIGS. 2 to 6) orthogonal or transverse to two other opposite edges 204 and 206 of the photodiode PD. The trenches 1261 are transverse to the trenches 1262.

Figure 2:
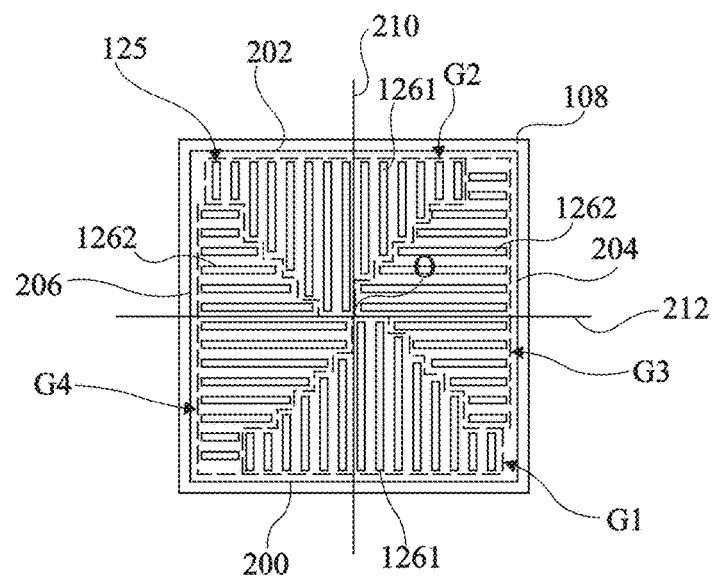
FIG. 2 is a schematic and top view of a diffractive structure of the pixel of FIG. 1 according to an embodiment.
Figure 3:
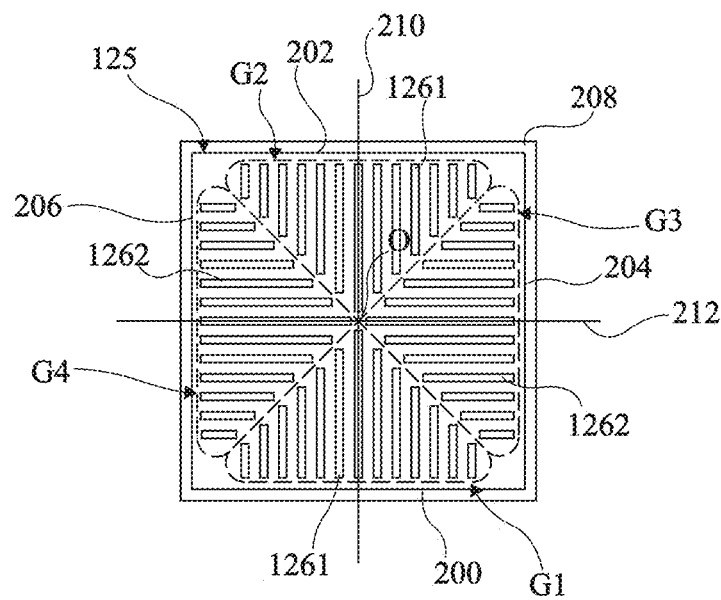
FIG. 3 is a schematic and top view of the diffractive structure of FIG. 2 according to an alternative embodiment.
Figure 6:
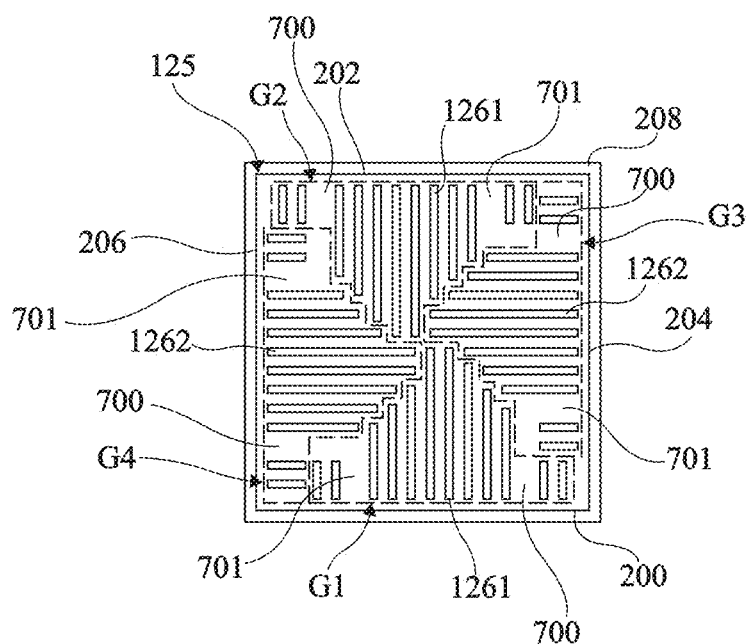
FIG. 6 is a schematic and top view of the diffractive structure of FIG. 2 according to a further alternative embodiment.

In FIGS. 2, 3 and 6, a part of the trenches 1261 forms a first diffraction grating G1 extending from the edge 200 towards the center O of the photodiode PD, and another part of the trenches 1261 forms a second diffraction grating G2 extending from the edge 202 towards the center O of the photodiode PD, the gratings G1 et G2 being delimited by dotted lines in FIGS. 2, 3 and 6. Similarly, a part of the trenches 1262 forms a third diffraction grating G3 extending from the edge 204 of the photodiode PD towards the center O of the photodiode PD, and another part of the trenches 1262 forms a fourth diffraction grating G4 extending from the edge 206 towards the center O of the photodiode PD, the gratings G3 et G4 being delimited by dotted lines in FIGS. 2, 3 and 6.

Figure 4:
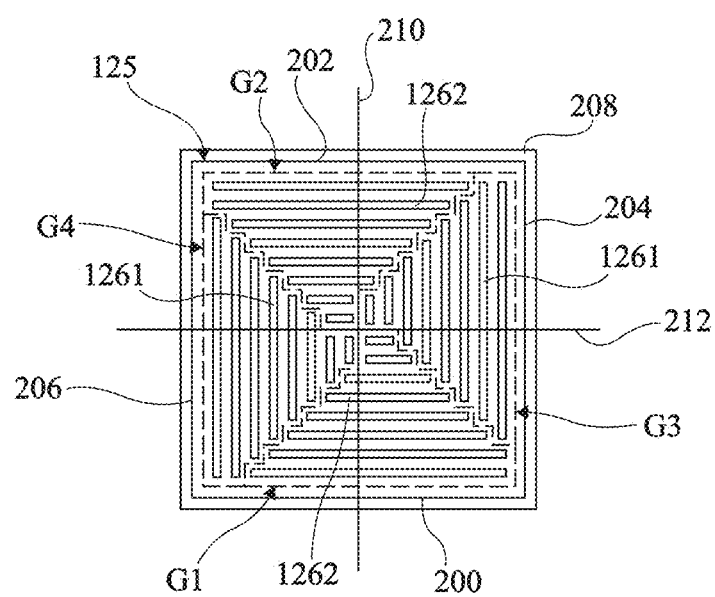
FIG. 4 is a schematic and top view of the diffractive structure of the pixel of FIG. 1 according to a further embodiment.
Figure 5:
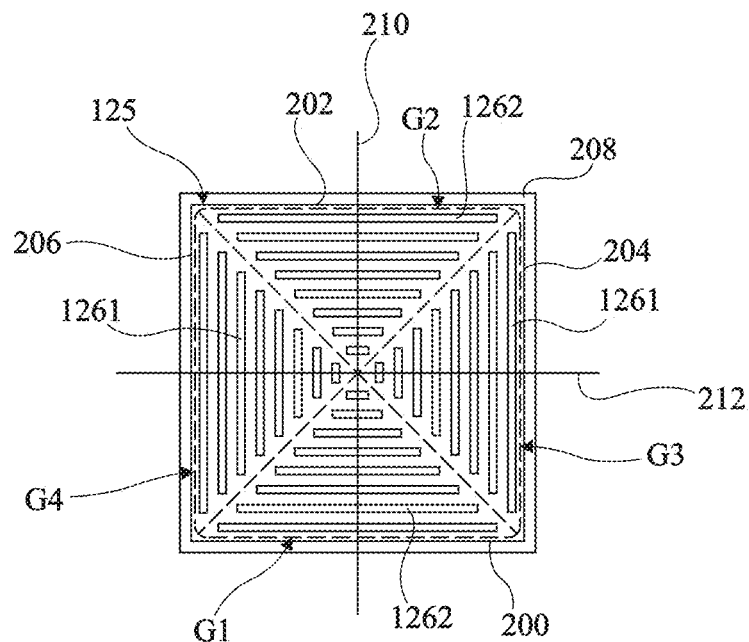
FIG. 5 is a schematic and top view of the diffractive structure of FIG. 4 according to an alternative embodiment.

In FIGS. 4 and 5, a part of the trenches 1262 forms a first diffraction grating G1 extending from the edge 200 towards the center O of the photodiode PD, and another part of the trenches 1262 forms a second diffraction grating G2 extending from the edge 202 towards the center O of the photodiode PD, the gratings G1 et G2 being delimited by dotted lines in FIGS. 4 and 5. Similarly, a part of the trenches 1261 forms a third diffraction grating G3 extending from the edge 204 of the photodiode PD towards the center O of the photodiode PD, and another part of the trenches 1261 forms a fourth diffraction grating G4 extending from the edge 206 towards the center O of the photodiode PD, the gratings G3 et G4 being delimited by dotted lines in FIGS. 4 and 5.

According to an embodiment, the gratings G1, G2, G3 and G4 do not intersect.

According to an embodiment, in a plane parallel to the face 106 of the substrate 102 (FIG. 1), each of the gratings G1, G2, G3 and G4 occupies an area having a triangular shape. A base of this triangular shape is parallel to the edge respectively 200, 202, 204 and 206 from which the grating extends, and is disposed on the side of this edge, for example on this edge. The summit of the triangular shape, which is located opposite the base, is disposed near the center O of the photodiode PD, for example on the center O.

In the embodiment of FIG. 2, the gratings G1 and G2, respectively G3 and G4, are, for example, identical to each other, but disposed according to different orientations, the gratings G1, G2, G3, and G4 being, for example, identical to each other, but disposed according to different orientations.

In the embodiment of FIG. 2, the grating G1 is not symmetrical with respect to a plane 210 orthogonal to the edge 200 from which the grating G1 extends, the plane 210 passing through the middle of the edge 200, or, said in other words, dividing the edge 200 in two parts having the same length. Similarly, in the embodiment of FIG. 2, the grating G2 is not symmetrical with respect to the plane 210.

In the embodiment of FIG. 2, the grating G3 is not symmetrical with respect to a plane 212 orthogonal to the edge 204 from which the grating G2 extends, the plane 212 passing through the middle of the edge 204. Similarly, in the embodiment of FIG. 2, the grating G4 is not symmetrical with respect to the plane 212.

The embodiment of FIG. 3 differs from the one of FIG. 2 in that each of the gratings G1 and G2 is symmetrical with respect to the plane 210, and each of the gratings G3 and G4 is symmetrical with respect to the plane 212.

The dissymmetry between the gratings of the diffractive structure 125 of the pixel 1 of FIG. 2 allows, for example, that the trenches density near the center O of the photodiode PD is higher than in the pixel 1 of FIG. 3, in which the gratings are symmetrical. This results from the fact that, in FIG. 2, the spacing between a trench belonging to given grating and a trench belonging to an adjacent grating is normal to a longitudinal side of one of these trenches, and extends between this longitudinal side and an extremity of the other of these trenches, whereas, in FIG. 3, the spacing between these two trenches is taken along a diagonal passing by a corner of an extremity of one of these trenches and by a corner of an extremity of the other of these trenches.

In the embodiment of FIG. 4, the gratings G1 and G2, respectively G3 and G4, are, for example, identical to each other, but disposed according to different orientations, the gratings G1, G2, G3, and G4 being, for example, identical to each other, but disposed according to different orientations.

In the embodiment of FIG. 4, the grating G1 is not symmetrical with respect to the plane 210. Similarly, in the embodiment of FIG. 4, the grating G2 is not symmetrical with respect to the plane 210.

In the embodiment of FIG. 4, the grating G3 is not symmetrical with respect to the plane 212. Similarly, in the embodiment of FIG. 4, the grating G4 is not symmetrical with respect to the plane 212.

The embodiment of FIG. 5 differs from the one of FIG. 4 in that each of the gratings G1 and G2 is symmetrical with respect to the plane 210, and each of the gratings G3 and G4 is symmetrical with respect to the plane 212. Further, the gratings G1 and G2 are disposed symmetrically with respect to the plane 212, the gratings G3 and G4 being disposed symmetrically with respect to the plane 210.

As already explain in relation with the pixels 1 of FIGS. 2 and 3, the trenches density near the center O of the photodiode PD may be higher in the pixel 1 of FIG. 4 than in the pixel 1 of FIG. 5.

FIG. 6 illustrates an alternative embodiment of the diffractive structure 125 illustrated by FIG. 2.

In this alternative embodiment, at least one of the gratings G1, G2, G3 and G4 comprises a periodicity defect or variation, that is to say a defect in the periodicity of the grating.

In the example of FIG. 6, each of the gratings G1, G2, G3 and G4 comprises the same periodicity defect.

In the example of FIG. 6, the periodicity defect corresponds to two trenches 126 which have been omitted in the grating (at respective locations 700 and 701 for each grating in FIG. 6). In the example of FIG. 6, in each grating G1, G2, G3 and G4, the two periodicity defects are symmetrical to each other, with respect to the plane of symmetry of the grating.

Other type of periodicity defect can be provided in at least one of the grating G1, G2, G3 and G4, possibly in a symmetrical manner in each grating, possibly in combination with at least one missing trench 126. These other types of periodicity defects, which can be used in combination in a given grating G1, G2, G3 or G4, are, for example, a modification of the width of a trench and a local modification of the pitch between the trenches of the grating.

The provision of at least one periodicity defect in at least one of the gratings G1, G2, G3 and G4 allows further improve the quantum efficiency or to reduce the crosstalk between two adjacent photodiodes PD (FIG. 1) or to prioritize a specific mode of the light, that is to say a specific wavelength allowed to propagate in the photodiode PD of the pixel.

Depending on the targeted result, those skilled in the art are capable of choosing the number, the type and the location of the periodicity defect in each grating G1, G2, G3, G4, for example by using a simulation tool such that the tool designated by the commercial appellation "Lumerical".

Those skilled in the art are capable of implement the alternative embodiment of the FIG. 6 in the diffractive structure 125 of each of the FIGS. 3 to 5. The diffractive structure 125 of the types described in relation with FIGS. 2 to 6 allows a better quantum efficiency of the pixel compared to a similar pixel wherein the diffractive structure would be implemented (in a top view) by concentric circular trenches, by line-shaped trenches all parallel to each other, by grating patterns which are not line-shaped, by periodic trenches or grooves which intersect, for example, in a lattice pattern arrangement, or by a random structuration.

In the embodiments described in relation with FIGS. 2, 3 and 6, the trenches 1261 of each of the gratings G1 and G2 are orthogonal (in the direction of their lengths) to the edge 200, respectively 202, from which the grating extends, and the trenches 1262 of each of the gratings G3 and G4 are orthogonal (in the direction of their lengths) to the edge 204, respectively 206, from which the grating extends. This allows to obtain a quantum efficiency higher than in the case of FIGS. 4 and 5 where the trenches 1262 of each of the gratings G1 and G2 are parallel (in the direction of their lengths) to the edge 200, respectively 202, from which the grating extends, and the trenches 1261 of each of the gratings G3 and G4 are parallel (in the direction of their lengths) to the edge 204, respectively 206, from which the grating extends.

The pixel 1 which has been described in relation with FIG. 1, is said to be a back side illuminated pixel as it receives light on the side of the face 106 of the substrate 102 which is located opposite the face 104 of the substrate 102 on which the structure IT rests. Those skilled in the art are capable of adapting the above description to the case of a front side illuminated pixel, that is to say a pixel which receives light on the side of the face 104 of the substrate 102, on which the structure IT rests.

Further, although in all the embodiments of the diffractive structure 125 which have been described above, the diffractive structure comprises trenches 126 penetrating into the substrate 102, those skilled in the art are capable of adapting the above description to the case where the diffractive structure 125 is made of bars in one or several first dielectric materials, embedded in a layer made of one or several second dielectric materials having a refractive index different from those of the first dielectric materials, the bars being then, for example, arranged as described for the trenches 1261, 1262 in relation with the FIGS. 2 to 6.

Further, the present description is not limited to a substrate 102 made of silicon. For example, in other embodiments, the substrate 102 comprises or is made of germanium or silicon-germanium.

More generally, the present description is not limited to the case where the operating wavelength(s) of the pixel 1 are in the near infrared. Those skilled in the art are capable of adapting the above description to the case where the operating wavelength(s) of the pixel 1 belong to another wavelengths range, for example by adapting the dimensions and/or the pitch of the trenches 126 and/or by adapting the material of the substrate 102, the layer 108 and/or the layer 110.

Various embodiments and variants have been described. Those skilled in the art will understand that certain features of these embodiments can be combined and other variants will readily occur to those skilled in the art. In particular, although it has been indicated that the photodiode PD is preferably configured to be used as a SPAD, this is not a necessary feature of the photodiode PD. Further, those skilled in the art are capable of providing a pixel 1 in different imaging applications, for example in adaptative optics, in a LiDAR ("Light Detection And Ranging) sensor, in a direct or indirect TOF ("Time Of Flight") sensor, etc.

Finally, the practical implementation of the embodiments and variants described herein is within the capabilities of those skilled in the art based on the functional description provided hereinabove.

A pixel, (1) may be summarized as including a photodiode (PD) including a portion (100) of a substrate (102) made of a semiconductor material, extending vertically from a first face (104) of the substrate (102) to a second face (106) of the substrate (102) located opposite the first face (104) and configured to receive light at an operating wavelength of the pixel (1); a layer (108) of a first material with a refractive index lower than a refractive index of the semiconductor material covering each of the lateral surfaces of said portion (100); a layer (110) of a second material with a refractive index lower than the refractive index of the semiconductor material covering said portion (100) on the side of the first face (104); and a diffractive structure (125) disposed on a face of the photodiode (PD) on the side of the second face (106) of the substrate (102).

Each of the first and second materials may be configured so that light at an operating wavelength of the pixel (1) reaching an interface between the photodiode (PD) and said material with an angle of incidence greater than 30° is fully reflected.

The semiconductor material may be silicon, the first material being silicon oxide and/or the second material being silicon oxide.

The layer (108) of the first material may have a first surface in contact with said portion (100) and a second surface located opposite the first surface covered with a metallic layer (109); and/or the layer (110) of the second material may have a first surface in contact with said portion (100) and a second surface located opposite the first surface covered with a metallic layer.

The diffractive structure (125) may be configured to diffract light at an operating wavelength of the pixel (1), which reaches the photodiode (PD) on the side of the second face (106) of the substrate, mainly in two directions orthogonal to each other when projected onto a plane parallel to the second face (106).

The diffractive structure (125) may include trenches (126; 1261, 1262) penetrating into said portion (100) from the second face (106) of the substrate (102), the trenches (126; 1261, 1262) being filled with one or several third dielectric materials having a refractive index different from that of the semiconductor material.

The trenches (126; 1261, 1262) of the diffractive structure (125) which are parallel to each other may be arranged at a pitch equal to twice an operating wavelength inside the pixel (1), at more or less 20%.

In a plane parallel to the second face (106), said photodiode (PD) may have a square or rectangular shape.

In a plane parallel to the second face, the trenches (126) may include first trenches (1261) extending longitudinally in a first direction orthogonal to first (200) and second (202) opposite edges of the photodiode (PD), and second trenches (1262) extending longitudinally in a second direction orthogonal to third (204) and fourth (206) opposite edges of the photodiode (PD).

The first trenches (1261) may not contact the second trenches (1262).

In a plane parallel to the second face (106) a part of the first trenches (1261) may form a first diffraction grating (G1) extending from the first edge (200) towards the center (O) of the photodiode (PD); another part of the first trenches (1261) may form a second diffraction grating (G2) extending from the second edge (202) of the photodiode (PD) towards the center (O) of the photodiode (PD); a part of the second trenches (1262) may form a third diffraction grating (G3) extending from the third edge (204) of the photodiode (PD) towards the center (O) of the photodiode (PD); and another part of the second trenches (1262) may form a fourth diffraction grating (G4) extending from the fourth edge (206) of the photodiode (PD) towards the center of the photodiode (PD).

The first, second, third and fourth gratings (G1, G2, G3, G4) may not intersect.

At least one of the first, second, third and fourth gratings (G1, G2, G3, G4) may include at least one periodicity defect among an omitted trench, a modification of the width of a trench with respect to the other trenches of the network, and a local modification of the pitch at which the trenches of the network are arranged.

In a plane parallel to the second face (106) a part of the second trenches (1262) may form a first diffraction grating (G1) extending from the first edge (200) towards the center (O) of the photodiode; another part of the second trenches (1262) may form a second diffraction grating (G2) extending from the second edge (202) of the photodiode (PD) towards the center (O) of the photodiode (PD); a part of the first trenches (1261) may form a third diffraction grating (G3) extending from the third edge (204) of the photodiode (PD) towards the center (O) of the photodiode (PD); and another part of the first trenches (1261) may form a fourth diffraction grating (G4) extending from the fourth edge (206) of the photodiode (PD) towards the center (O) of the photodiode (PD).

The first, second, third and fourth gratings (G1, G2, G3, G4) may not intersect.

At least one of the first, second, third and fourth gratings (G1, G2, G3, G4) may include at least one periodicity defect among an omitted trench, a modification of the width of a trench with respect to the other trenches of the network, and a local modification of the pitch at which the trenches of the network are arranged.

The photodiode (PD) may be configured to be used as a single photon avalanche photodiode, an operating wavelength of the pixel preferably belonging to a range from 700 nm to 2000 nm and being, for example, equal to 940 nm.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pixel, comprising:
   a substrate;
   a photodiode in the substrate between a first face of the substrate and a second face that is opposite the first face of the substrate, the photodiode including a first lateral surface transverse to the first and second faces of the substrate;
   a first layer of a first material with a refractive index lower than a refractive index of the substrate on the first lateral surface of the photodiode;
   an anti-reflective layer on the second face of the substrate;
   a micro-lens on the anti-reflective layer; and
   a diffractive structure on the photodiode on the second face of the substrate, the diffractive structure including a first grating pattern in a first orientation, a second grating pattern immediately adjacent to and distinct from the first grating pattern.

2. The pixel of claim 1, wherein the first layer of the first material entirely covers the first lateral surface of the photodiode.

3. The pixel of claim 1, wherein the first material is a dielectric material that reflects a light propagating into the photodiode.

4. The pixel of claim 1, wherein the first layer of the first material is between the first lateral surface of the photodiode and a metallic layer.

5. The pixel of claim 1, wherein the first layer of the first material is formed by etching a trench into the substrate and depositing the first material on a plurality of walls of the trench.

6. The pixel of claim 1, further comprising a second layer of the first material on the first face of the substrate.

7. The pixel of claim 1, wherein the anti-reflective layer filters a certain range of wavelengths of a light propagating into the photodiode.

8. The pixel of claim 6, further comprising an interconnect structure on first face of the substrate, the interconnect structure including:
   the second layer of the first material;
   an insulating layer on the second layer of the first material;
   a plurality of conductive layers extending along a first direction in the insulating layer; and
   a plurality of electrically conductive vias transverse to the conductive layers, the plurality of electrically conductive vias coupling the plurality of conductive layers to the substrate.

9. The pixel of claim 8, further comprising a plurality of contact pads on a first side of the interconnect structure opposite the first face of the substrate, the contact pads being coupled to the plurality of electrically conductive vias.

10. The pixel of claim 1, further comprising a third layer of the first material between the second face of the substrate and the anti-reflective layer.

11. The pixel of claim 1, wherein a microlens focalizes a light received by the pixel toward the photodiode.

12. The pixel of claim 8, wherein the diffractive structure includes a plurality of trenches extending into the substrate from the second face along a second direction transverse to the first direction.

13. A device, comprising:
    a substrate;
    a plurality of pixels aligned along a first direction, each pixel including:
       a photodiode in the substrate, the photodiode including a first face opposite a second face and a plurality of sidewalls transverse to the first direction;
       a first layer on each of the plurality of sidewalls of the photodiode;
       a conductive layer between each photodiode;
       a micro-lens on the second face;
       a first plurality of trenches in the second face and extending along a second direction, each of the first plurality of trenches having a different dimension along the second direction; and
       a second plurality of trenches in the second face and extending along a third direction transverse to the second direction.

14. The device of claim 13, wherein each photodiode has a plurality of sides in the range of 2 micrometers and 20 micrometers.

15. The device of claim 13, wherein each of the first plurality of trenches and each of the second plurality of trenches are filled with a dielectric material.

16. The device of claim 15, wherein the first layer has a first refractive index lower than a second refractive index of the substrate.

17. The device of claim 16, wherein the dielectric material has a third refractive index different from the second refractive index.

18. A device, comprising:
    a photodiode with a first surface opposite a second surface;
    an interconnect structure on the first surface;
    a microlens on the second surface; and
    a diffractive structure between the second surface and the microlens, the diffractive structure including a first grating pattern in a first direction and a second grating pattern distinct from the first grating pattern in a second direction, the first and second grating patterns being identical and disposed in different orientations.

19. The device of claim 18, wherein the photodiode includes a first lateral surface extending between the first and second surfaces, the first lateral surface being covered by a layer of a first material and a metal layer.

20. The device of claim 18, further comprising an anti-reflective layer on the second surface of a substrate.

* * * * *